(12) United States Patent
Rappoport et al.

(10) Patent No.: US 12,706,036 B2
(45) **Date of Patent: *Aug. 11, 2026**

(54) DEVICES AND METHODS FOR PROVIDING ACCESS TO INTERNAL COMPONENT

(71) Applicant: Apple Inc., Cupertino, CA (US)

(72) Inventors: Benjamin Mark Rappoport, Santa Barbara, CA (US); Christopher J. Stringer, Woodside, CA (US); Fletcher R. Rothkopf, Los Altos, CA (US); Jeremy C. Franklin, San Francisco, CA (US); John Patrick Ternus, Los Altos Hills, CA (US); Julian Hoenig, Lisbon (PT); Richard P. Howarth, San Francisco, CA (US); Scott Andrew Myers, Saratoga, CA (US); Stephen Brian Lynch, Portola Valley, CA (US)

( * ) Notice: Subject to any disclaimer, the term of this patent is extended or adjusted under 35 U.S.C. 154(b) by 407 days.

This patent is subject to a terminal disclaimer.

(21) Appl. No.: 17/377,198

(22) Filed: Jul. 15, 2021

(65) Prior Publication Data

US 2021/0343235 A1 Nov. 4, 2021

Related U.S. Application Data

(63) Continuation of application No. 16/029,395, filed on Jul. 6, 2018, now Pat. No. 11,074,855, which is a (Continued)

(51) Int. Cl.
*G09G 3/32* (2016.01)
*G06F 3/0481* (2022.01)
(Continued)

(52) U.S. Cl.
CPC ......... *G09G 3/3225* (2013.01); *G06F 3/0481* (2013.01); *G06F 3/0412* (2013.01); (Continued)

(58) Field of Classification Search
CPC ......... G09G 3/3225; G09G 2320/0626; G09G 2300/0456; G09G 2300/046; (Continued)

(56) References Cited

U.S. PATENT DOCUMENTS 5,159,445 A * 10/1992 Gitlin .................... H04N 7/144 348/E7.08
5,349,174 A 9/1994 Van Berkel et al.
(Continued)

*Primary Examiner* — Chanh D Nguyen
*Assistant Examiner* — Jarurat Suteerawongsa
(74) *Attorney, Agent, or Firm* — Treyz Law Group, P.C.; Kendall P. Woodruff

(57) ABSTRACT

Systems, methods, and devices are disclosed for applying concealment of components of an electronic device. In one embodiment, an electronic device may include a component that is disposed behind a display (e.g., a transparent organic light-emitting diode (OLED) display) that is configured to selectively become transparent at certain transparency regions. Additionally, the electronic device includes data processing circuitry configured to determine when an event requesting that the component be exposed occurs. The data processing circuitry may control portions of the display to become transparent, to expose the component upon the occurrence of the event requesting that the component be exposed.

10 Claims, 7 Drawing Sheets

Related U.S. Application Data continuation of application No. 15/240,472, filed on Aug. 18, 2016, now Pat. No. 10,019,940, which is a continuation of application No. 13/308,119, filed on Nov. 30, 2011, now Pat. No. 9,437,132.

(51) Int. Cl.
*G09G 3/3225* (2016.01)
*G06F 3/041* (2006.01)
*H10K 59/40* (2023.01)

(52) U.S. Cl.
CPC .............. *G06F 2203/04804* (2013.01); *G09G 2300/0456* (2013.01); *G09G 2300/046* (2013.01); *G09G 2320/0626* (2013.01); *G09G 2320/0686* (2013.01); *G09G 2330/022* (2013.01); *G09G 2354/00* (2013.01); *G09G 2360/14* (2013.01); *G09G 2360/144* (2013.01); *H10K 59/40* (2023.02)

(58) Field of Classification Search
CPC ..... G09G 2320/0686; G09G 2330/022; G09G 2354/00; G09G 2360/14; G09G 2360/144; G09G 3/32; G06F 3/0481; G06F 3/0412; G06F 2203/04804; H10K 59/40
See application file for complete search history.

(56) References Cited

U.S. PATENT DOCUMENTS 7,495,895 B2 2/2009 Carnevali
7,495,927 B2 2/2009 Furihata et al.
7,697,053 B2 4/2010 Kurtz et al.
8,176,437 B1 5/2012 Taubman
8,203,546 B2 6/2012 Watson et al.
8,384,690 B2 2/2013 Anderson et al.
8,467,177 B2 6/2013 Mathew et al.
8,633,916 B2 1/2014 Bernstein et al.
9,086,787 B2 * 7/2015 Park .................... G06F 1/1643
2002/0021561 A1 2/2002 Yamauchi et al.
2002/0167809 A1 11/2002 Glass
2002/0196517 A1 12/2002 Nimura
2003/0016189 A1 1/2003 Abe et al.
2003/0067424 A1 4/2003 Akimoto et al.
2003/0081158 A1 5/2003 Li et al.
2004/0233038 A1 * 11/2004 Beenau .............. G06Q 20/3278 340/5.4
2004/0263670 A1 12/2004 Yamasaki
2005/0083269 A1 4/2005 Lin et al.
2005/0200291 A1 9/2005 Naugler et al.
2005/0200293 A1 9/2005 Naugler et al.
2007/0002130 A1 * 1/2007 Hartkop ............... H04N 13/144 348/E7.078
2007/0153119 A1 * 7/2007 Bilbrey .................. H04N 7/142 348/E5.042
2008/0018555 A1 1/2008 Kuo et al.
2008/0106629 A1 * 5/2008 Kurtz ..................... H04N 7/144 348/E5.022
2008/0128728 A1 6/2008 Nemchuk et al.
2008/0165267 A1 * 7/2008 Cok ....................... H04N 7/144 348/E5.022
2008/0192237 A1 * 8/2008 Yamamoto ............ G06F 3/0412 356/73
2008/0266273 A1 * 10/2008 Slobodin ............... G06F 3/0446 345/173
2008/0273014 A1 * 11/2008 Lowles ................... G06F 3/045 345/173
2008/0309633 A1 12/2008 Hotelling et al.
2009/0015761 A1 1/2009 Stockham
2009/0102763 A1 4/2009 Border et al.
2009/0184936 A1 7/2009 Algreatly
2009/0322706 A1 * 12/2009 Austin .................... G06F 3/038 345/175
2010/0138763 A1 6/2010 Kim et al.
2010/0188353 A1 * 7/2010 Yoon ................... G06F 3/04883 345/173
2010/0194697 A1 * 8/2010 Hotelling .............. G06F 3/0412 345/55
2010/0194705 A1 * 8/2010 Kim ...................... G06F 3/0488 345/173
2010/0245741 A1 9/2010 Chung et al.
2010/0282953 A1 * 11/2010 Tam .......................... G01J 1/32 356/402
2010/0283762 A1 11/2010 Takusa
2011/0141034 A1 * 6/2011 Lai ...................... G06F 3/04164 345/173
2011/0141151 A1 * 6/2011 Fujioka ................... G06F 3/042 345/690
2012/0032926 A1 * 2/2012 Douxchamps ........ G06F 3/0425 345/175
2012/0105400 A1 * 5/2012 Mathew ................ G06F 1/1686 345/207
2012/0148115 A1 6/2012 Birdwell et al.
2012/0257004 A1 * 10/2012 Smith .................... H04N 7/144 348/E7.083
2013/0135256 A1 * 5/2013 Hong .................... G06F 3/0445 345/76
2020/0285092 A1 * 9/2020 Lin ..................... G02F 1/13306

* cited by examiner 36
18
40
36
18
46
40
42
29

DEVICES AND METHODS FOR PROVIDING ACCESS TO INTERNAL COMPONENT

This application is a continuation of patent application Ser. No. 16/029,395, filed Jul. 6, 2018, which is a continuation of patent application Ser. No. 15/240,472, filed Aug. 18, 2016, now U.S. Pat. No. 10,019,940, which is a continuation of patent application Ser. No. 13/308,119, filed on Nov. 30, 2011, now U.S. Pat. No. 9,437,132, all of which are hereby incorporated by reference herein in their entireties.

BACKGROUND

The present disclosure relates generally to the industrial design of an electronic device and, more particularly, to techniques for disposing components of an electronic device behind a transparent display, such as an organic light-emitting diode (OLED) display.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Electronic devices are becoming more and more sophisticated, capable of performing a multitude of tasks using a variety of components built into the electronic device. Providing increased functionality often involves adding components to such electronic devices. However, adding more components can lead to a cluttered, unattractive electronic device.

Current techniques for incorporating components into an electronic device may be limited by the relative sizes of the components and the electronic device. The larger the components and the smaller the electronic device, the less spatial area there may be to incorporate additional components. For example, a small electronic device where a large display covers most of the face of the electronic device may not allow for any additional components, such as a fingerprint reader, to be added to the electronic device. Furthermore, under the current techniques, adding new components may harm the aesthetic appeal of the device by cluttering the electronic device enclosure, even though these additional components may be seldom or never used by many users. An electronic device that incorporates multiple components may lose its aesthetic appeal when covered by visible components, particularly as compared to a seamless electronic device where very few, if any, components of the electronic device are visible.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure generally relates to techniques for disposing components of an electronic device behind a transparent display. Disposing the components behind the transparent display of the electronic device, may enable the components to remain hidden from view while not in use. When desired, the components of the electronic device may be exposed, allowing the components to suddenly appear as from out of nowhere. In accordance with one embodiment, an electronic device may include a transparent display with a component of the electronic device disposed behind the display. Upon detecting an event associated with the component, a processor of the electronic device may make transparent, or "open," a transparent region (e.g., through generating a local or global black spot) of the display to expose the component. The black spot may be generated when pixels of the display are not emitting light in certain areas. To provide one example, such an event may occur when a feature of the electronic device requests exposure of concealed components. For example, when an image capture application of the electronic device is not in use, an image capture device and/or associated strobe may remain hidden behind the display of the electronic device. Upon detecting this request, the processor may open one or more transparent regions (e.g., generate black spots), causing the image capture device and/or the associated strobe to suddenly appear from behind the display.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. Again, the brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

Figure 1:
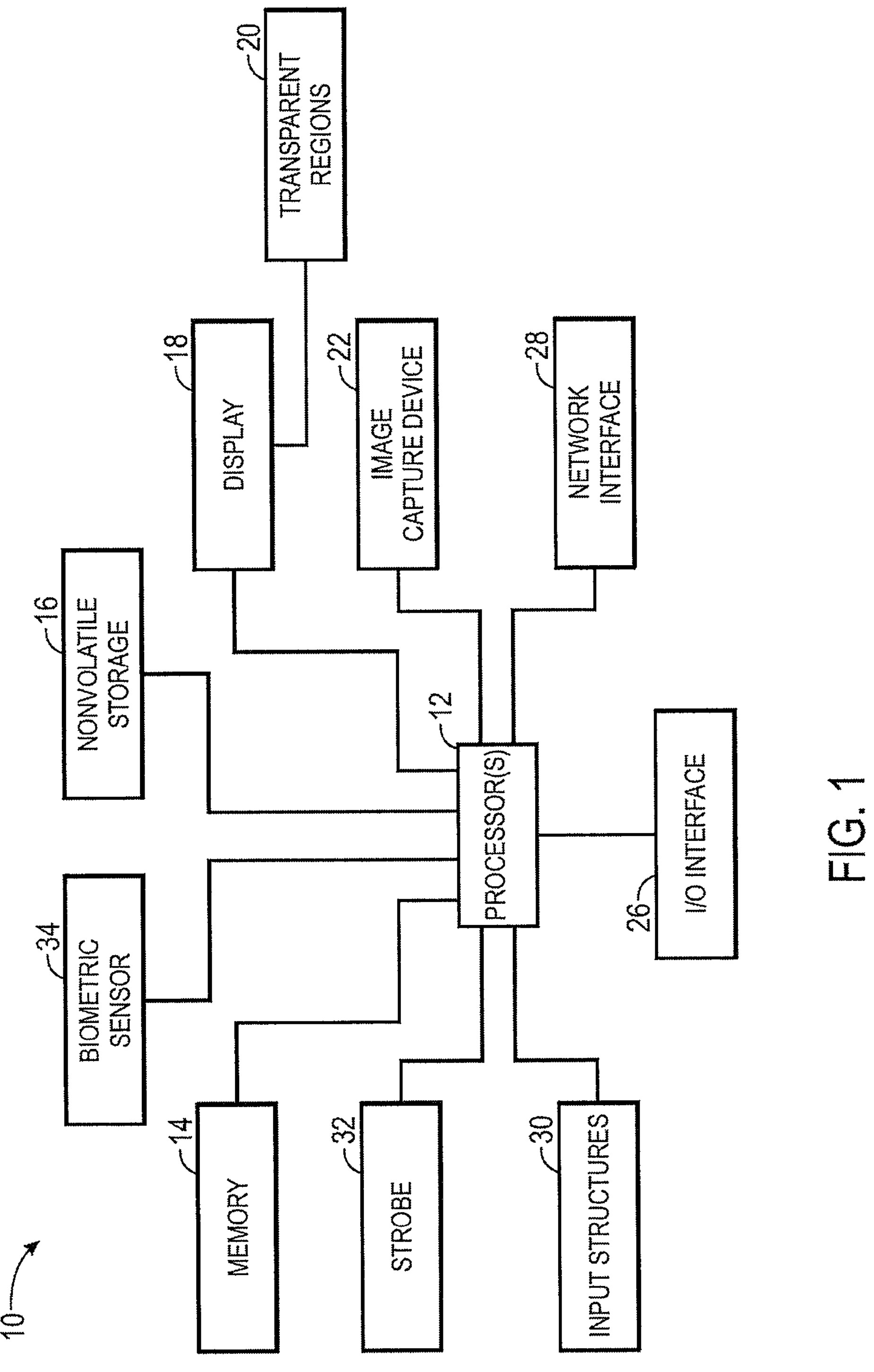
FIG. 1 is a block diagram of an electronic device capable of performing the techniques disclosed herein, in accordance with an embodiment.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The present disclosure generally provides techniques for enhancing the functionality and aesthetic appeal of an electronic device by disposing components of the electronic device behind a display of the electronic device. To avoid cluttering the enclosure of an electronic device with various components, many different electronic device components may be disposed behind the display of the electronic device. Perhaps most noteworthy are components that, when functioning properly, have traditionally required external exposure to light or that emit light. For example, these "light-dependent components" may include an optical scanner (e.g., a biometric fingerprint scanner), an image capture device, a strobe, a light sensor, a proximity sensor, or a solar panel. Further, light-dependent components may include components that are configured to become visible when light is introduced, such as a printed image. Each of these components depend on light input or output light and thus have traditionally had at least a light input or light output portion of the component externally exposed when incorporated into an electronic device. Using the current techniques, these light-dependent components may be configured to be exposed from behind the display only when desired, and otherwise may remain hidden from view. These light-dependent components may remain hidden while the display is producing an image (e.g., emitting light) above the component and may become exposed when the display is not producing an image (e.g., emitting light) above the component.

Disposing components of an electronic device behind a display may provide an aesthetic benefit to the electronic device by allowing the components to remain unseen and hidden behind the display until access to the component is desired, creating a more seamless electronic device. Furthermore, the size of the display may increase because as components are disposed under the display, more surface real-estate of the device enclosure may become available. Additionally, because less surface real-estate may be needed to house the light-dependent components, in some embodiments, the electronic device may be reduced in size. Further, the aesthetic value may be greatly increased by allowing exposure to components from areas of the electronic device that a user would traditionally not expect.

Figure 2:
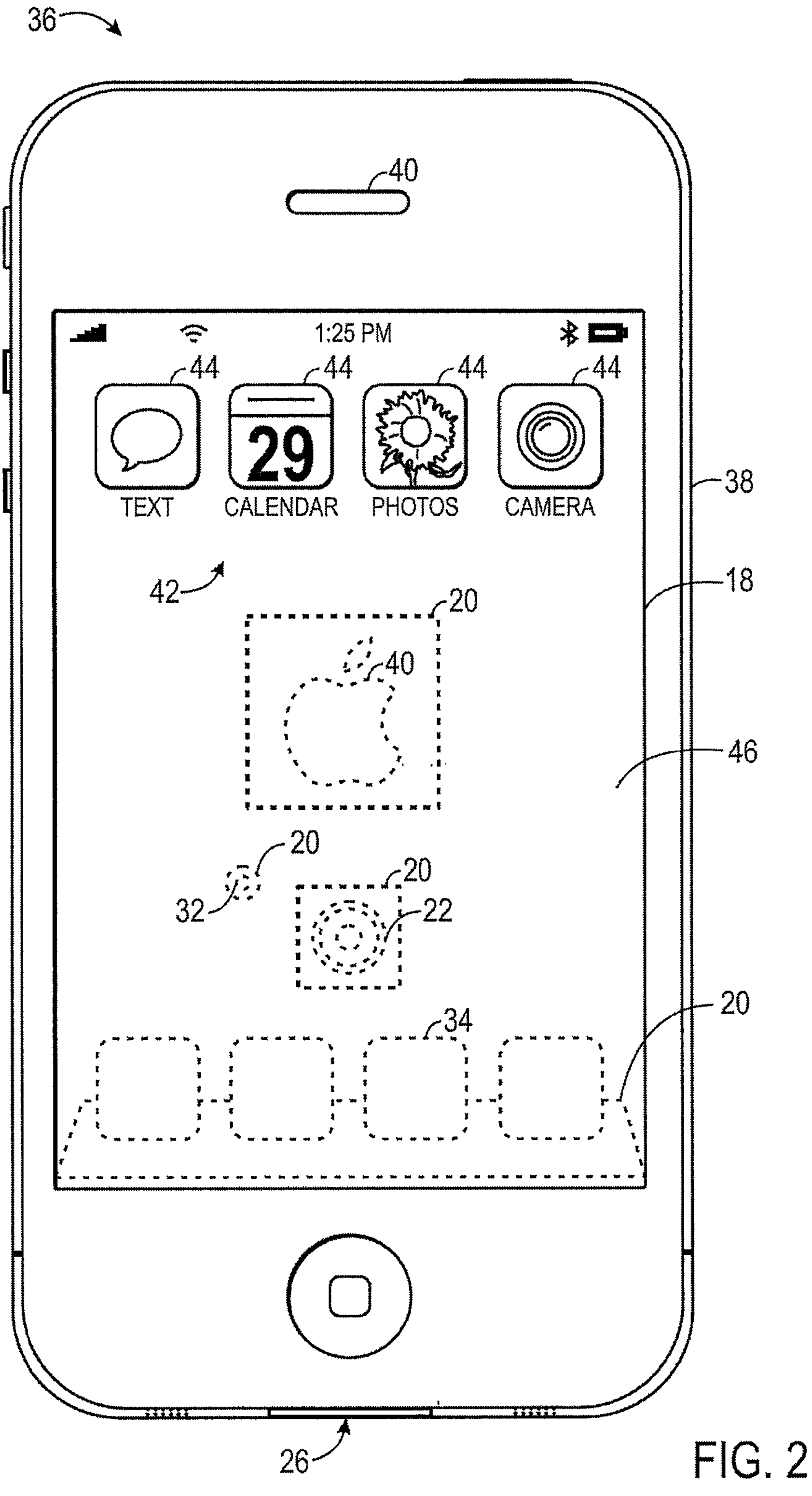
FIG. 2 is a schematic front view of a handheld device representing one embodiment of the electronic device of FIG. 1.

With the foregoing in mind, a general description of suitable electronic devices for performing the presently disclosed techniques is provided below. In particular, FIG. 1 is a block diagram depicting various components that may be present in an electronic device suitable for use with the present techniques. FIG. 2 represents one example of a suitable electronic device, which may be, as illustrated, a handheld electronic device having a transparent display.

Turning first to FIG. 1, an electronic device 10 for performing the presently disclosed techniques may include, among other things, one or more processors 12, memory 14, non-volatile storage 16, a display 18 with one or more transparent regions 20, image capture device(s) 22, an I/O interface 26, a network interface 28, input structures 30, a strobe 32, and a biometric sensor 34 (e.g., a fingerprint reader). As will be discussed further below, the transparent regions 20 of the display 18 may be disposed above certain of these components, such as image capture device(s) 22, a strobe 32, and/or an biometric sensor 34. The various functional blocks shown in FIG. 1 may include hardware elements (including circuitry), software elements (including computer code stored on a computer-readable medium) or a combination of both hardware and software elements. Further, FIG. 1 is only one example of a particular implementation and is merely intended to illustrate the types of components that may be present in the electronic device 10.

Before continuing, it should be understood that the system block diagram of the electronic device 10 shown in FIG. 1 is intended to be a high-level control diagram depicting various components that may be included in such an electronic device 10. That is, the illustrated connection lines between each individual component shown in FIG. 1 may not necessarily represent paths or directions through which data flows or is transmitted between various components of the electronic device 10. Indeed, as discussed below, the depicted processor(s) 12 may, in some embodiments, include multiple processors, such as a main processor (e.g., CPU), and dedicated image and/or video processors.

The processor(s) 12 and/or other data processing circuitry may be operably coupled with the memory 14 and the non-volatile storage 16 to perform various algorithms for carrying out the presently disclosed techniques. Such programs or instructions executed by the processor(s) 12 may be stored in any suitable manufacture that includes one or more tangible, computer-readable media at least collectively storing the instructions or routines, such as the memory 14 and the non-volatile storage 16. In example, non-volatile storage 16 may include ROM, CD-ROM, or RAM. Also, programs (e.g., an operating system) encoded on such memory 14 or non-volatile storage 16 may also include instructions that may be executed by the processor(s) 12 to enable the electronic device 10 to provide various functionalities, including those described herein.

The display 18 may be a touch-screen display that may enable users to interact with a graphical user interface of the electronic device 10. The display 18 may be any suitable type of transparent display, such as a transparent organic light-emitting diode (OLED) display, for example. Rather than clutter the electronic device 10, certain components of the electronic device 10 may be disposed behind the display 18. As will be described in more detail below, the display 18 includes one or more transparent regions 20 that define areas of transparency in the display 18. In some embodiments, the display 18 may include a global transparent region 20 that encompasses the entire viewable area of the display 18. In other embodiments, the display 18 may include one or more local transparent regions 20 that encompass only a portion of the viewable area of the display 18. Local transparent regions 20 may be tailored to any shape or size suitable for exposing one or more underlying components. For example, such components may be the image capture device(s) 22, the strobe 32, and/or the biometric sensor 34. In some embodiments, the components may include a solar panel, light sensor, proximity sensor, indicator light-emitting diodes (LEDs), alternative displays (e.g., E-Ink or other low powered displays), and/or reflective or colorful objects, such as an Apple logo, that becomes visible when light is introduced.

The image capture device(s) 22 may include a digital camera configured to acquire still and/or moving images (e.g., video). The image capture device(s) 22 may include a lens and one or more image sensors configured to capture and convert light into electrical signals. By way of example, the image sensor may include a CMOS image sensor (e.g., a CMOS active-pixel sensor (APS)) or a CCD (charge-coupled device) sensor. Generally, the image sensor in the image capture device(s) 22 may include an integrated circuit having an array of pixels, wherein each pixel includes a photodetector for sensing light from an image scene. The functionality of the image capture device(s) 22 may be enhanced by the use of a strobe 32. The strobe 32 may include a light-emitting diode (LED) light source configured to illuminate the subject of the image capture device(s) 22.

The biometric sensor 34, such as a fingerprint reader, may be configured to take an optical scan of a subject and compare the scanned image to a stored image. The stored image data may be retrieved from the memory 14 and/or non-volatile storage 16. Based on the scan by the biometric sensor 34, the electronic device 10 may verify the identity of the user. Identity verification may provide a more secure electronic purchase method as well as a more secure unlocking method for the electronic device 10.

The I/O interface 26 may enable the electronic device 10 to interface with various other electronic devices, as may the network interface 28. The network interface 28 may include, for example, an interface for a personal area network (PAN), such as a Bluetooth network, for a local area network (LAN), such as an 802.11x Wi-Fi network, and/or for a wide area network (WAN), such as a 3G or 4G cellular network.

FIG. 2 represents one embodiment of the electronic device 10 of FIG. 1. The handheld device 36 of FIG. 2 may represent, for example, a cellular phone, a portable phone, a media player, a personal data organizer, a handheld game platform, a tablet computer, a notebook computer, or any combination of such devices. By way of example, the handheld device 36 may be a model of an iPad®, iPod®, iPhone®, or Macbook® available from Apple Inc. of Cupertino, California.

The handheld device 36 may include an enclosure 38 to protect interior components from physical damage and to shield them from electromagnetic interference. Traditionally, many light-dependent components occupied surface space of the enclosure 38 external to the display 18. However, in the current embodiment various components are disposed behind the display 18, thus utilizing less surface real-estate of the enclosure 38. For example, the embodiment of FIG. 2 includes an image capture device 22, a strobe 32, a biometric sensor 34 in the form of a fingerprint reader, and an image 40 (e.g., reflective and/or colorful object) disposed behind local transparent regions 20 of the handheld device 36.

As depicted, the display 18 may provide a graphical user interface (GUI) 42 with icons 44 and a background image 46. When displayed without any black regions (e.g., regions where no light is emitted), the GUI 42 may mask the transparent regions 20, and thus the components 22, 32, 34, and 40 may not be visible. However, upon desired use of a component, the processor 12 (FIG. 1) may generate one or more local black regions by selectively disabling an emission of light over one or more of the transparent regions 20 above the component. Upon generating the black region, the component is exposed through the transparent region 20, and thus becomes visible.

Figure 3:
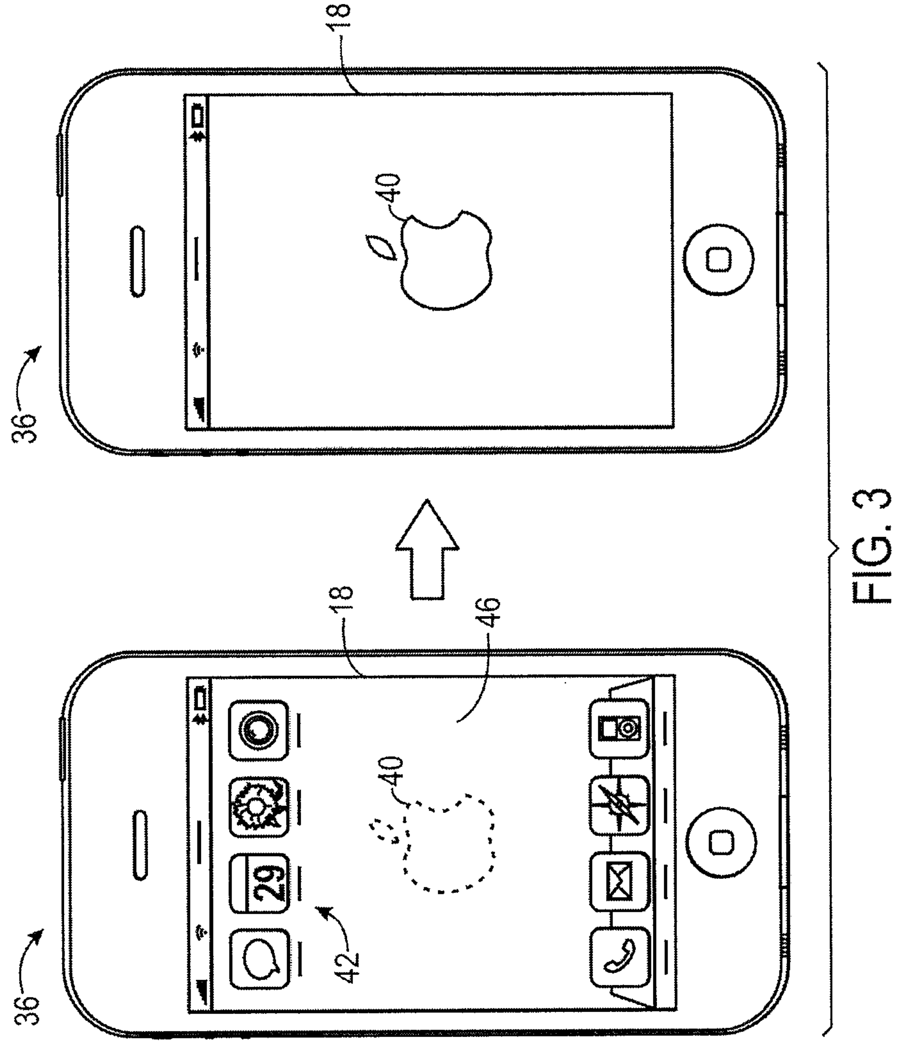
FIG. 3 is a schematic view of the handheld device illustrating an exposed component of the electronic device when the display is off, in accordance with an embodiment.

Further, in certain embodiments, one or more components may become visible upon removing power from the handheld device 36. For example, FIGS. 3A and 3B illustrate an embodiment of a handheld device 36 where power is removed from the display 18. Similar to the embodiment of FIG. 2, an image 40 is concealed behind the display 18 when the GUI 42 does not provide any black spots. Thus, as depicted in FIG. 3A, the image 40 is not visible while the display 18 emits light (e.g., provides a background image 46) over the image 40. However, as depicted in FIG. 3B, when the display 18 is powered-down, the light emitted over the image 40 may be reduced, such that the image 40 becomes visible through the display 18.

Figure 4:
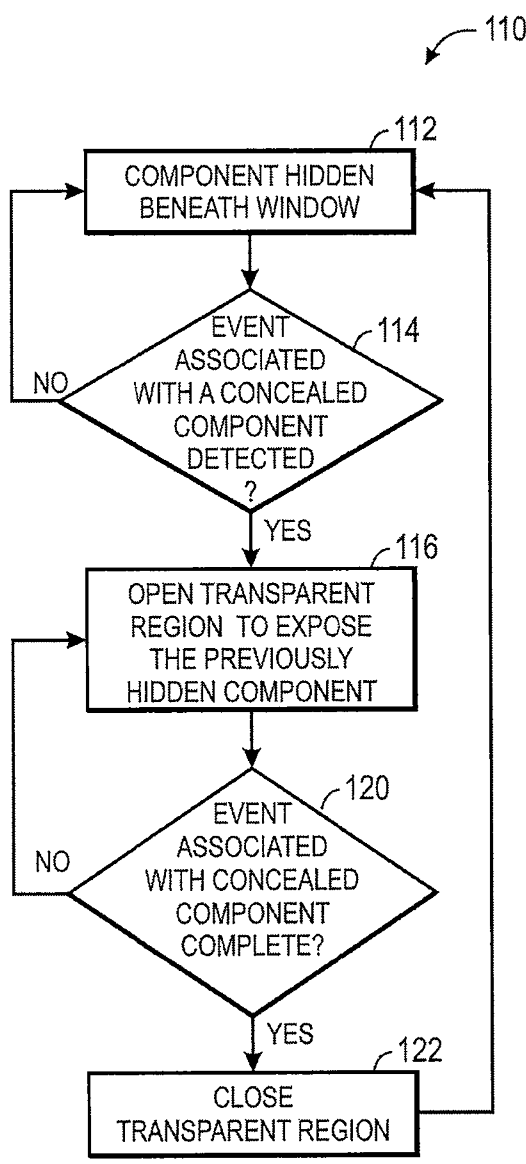
FIG. 4 is a flow diagram illustrating an embodiment of a process for exposing a component concealed behind a transparent display.

As noted above, the transparent display 18 may conceal a variety of components of the electronic device 10, such as the image capture device 22, the strobe 32, and/or a biometric sensor 34 such as a fingerprint reader, to name a few. To more clearly explain the component concealment process, a general description of such a process 110 will now be provided as depicted in FIG. 4. The process 110 is intended to provide an initial high level overview of the concealment process, with more specific details of the process, including examples, being described further below.

The process 110 begins at block 112, when a component (e.g., image capture device(s) 22) is concealed behind a transparent display 18. For example, the component may be concealed by displaying an image (e.g., emitting light) on the transparent display 18 over the component. Next, at decision block 114, the electronic device 10 (e.g., processor 12 of FIG. 1) may detect whether an event associated with the component has occurred (e.g., a camera application is launched that will use a concealed image capture device 22). If no such event has occurred, the component may remain concealed behind the transparent display 18, and the process may flow to block 112. On the other hand, if such an event has occurred, the process may flow to block 116, and the electronic device 10 (e.g., processor 12) may open a transparent region 20 over the component (e.g., image capture device(s) 22) to expose the component. For example, to open the transparent region 20, the processor 12 may control the display 18 to stop emitting light over a region, creating a black spot (e.g., transparent region 20) in the display 18. At decision block 120, the electronic device 10 (e.g., processor 12) may detect whether the event associated with the component has completed. If not, the component may remain exposed. Once the electronic device 10 detects that the event is complete (e.g., the camera application is closed), in block 122, the electronic device 10 (e.g., processor 12) may close the transparent region 20, thus concealing the component.

Figure 5:
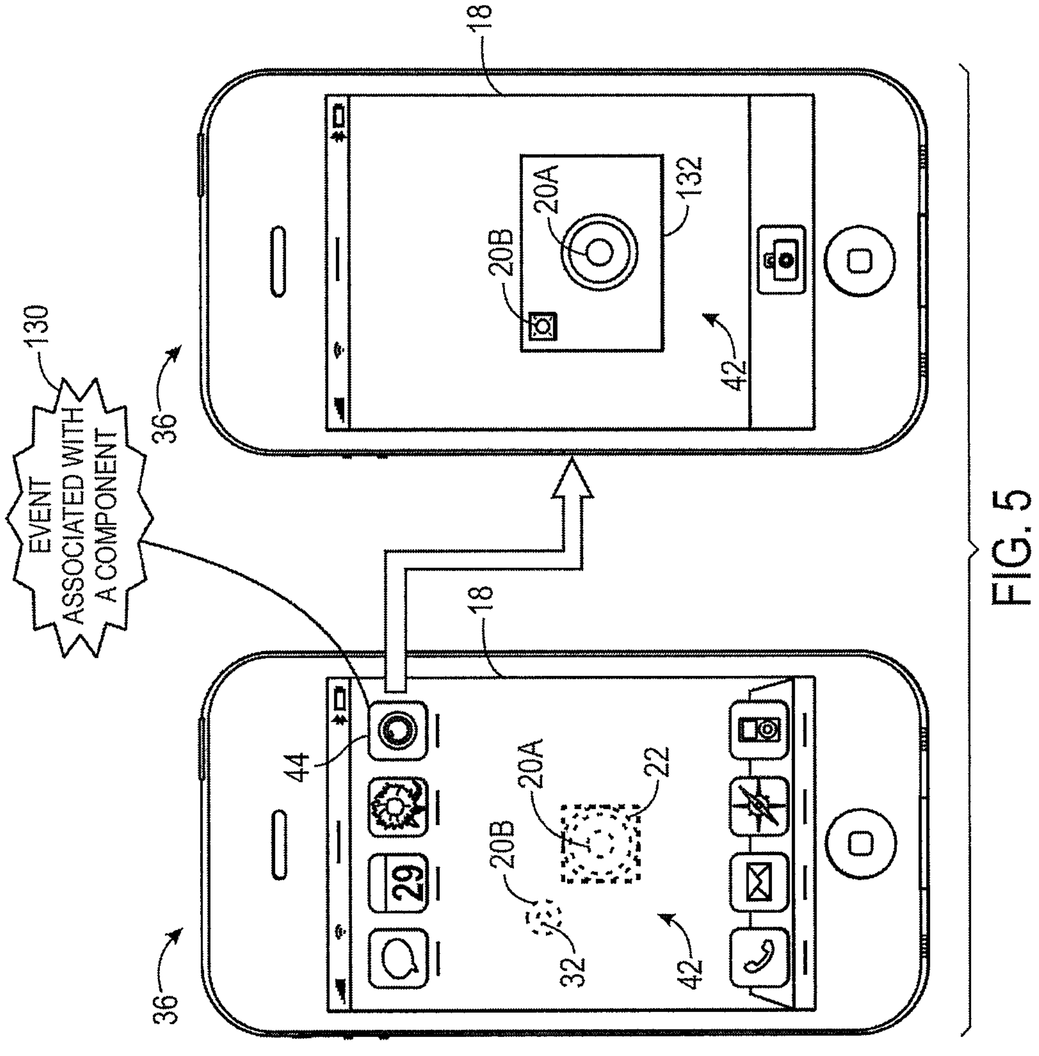
FIG. 5 is a schematic view of the handheld device illustrating a graphical user interface of the electronic device of FIG. 1 making use of a component disposed behind the display, in accordance with an embodiment.

An embodiment of the process 110 depicted in FIG. 4 is illustrated in FIG. 5. In FIG. 5, the handheld device 36 is shown to contain an image capture device 22 disposed behind transparent display 18. Upon selection of an image capture application by selecting the graphical user interface icon 44, the camera application is launched. The launching of the camera application may represent an event associated with the image capture device 22. Upon detection of such an event 130, the processor 12 of FIG. 1 may open the transparent region 20A over the image capture device 22. Thus, the image capture device 22 may be exposed, allowing images to be captured by the exposed image capture device 22. Further, additional transparent regions 20 may be opened to provide usability of other components. For example, in the current embodiment, the transparent region 20B over the strobe 32 may be opened to provide use of the strobe 32 as a flash for image capture. In some embodiments, the GUI 42 may emphasize the opened transparent regions 20 (e.g., 20A and 20B) by providing GUI 42 images notifying a user of the opened transparent regions 20. For example, in the depicted embodiment, the GUI 42 provides a camera image 132 around the image capture device 22 and the strobe 32, illustrating the locations of the image capture device 22 and the strobe 32.

Figure 6:
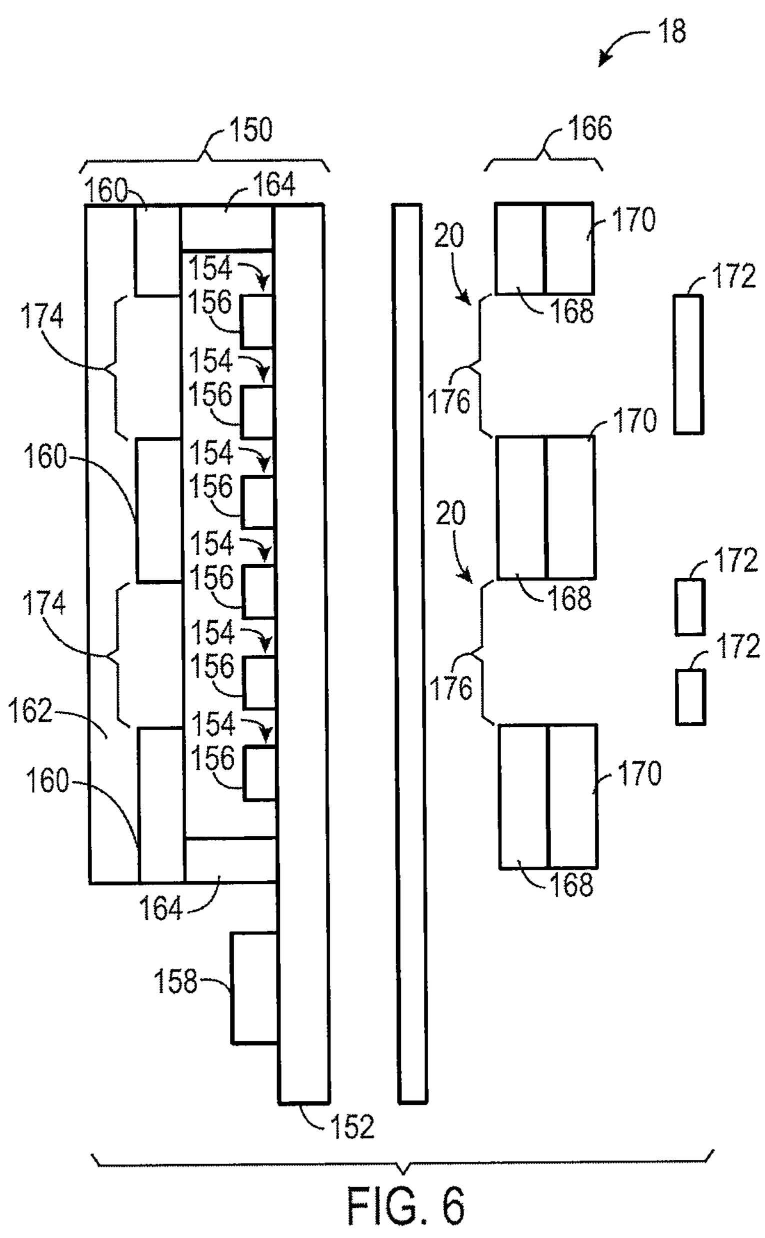
FIG. 6 is a cross-sectional view of the layers of a display useful for enabling the techniques disclosed herein, in accordance with an embodiment.

Turning now to a discussion of creating the transparent regions 20, FIG. 6 illustrates a cross-sectional view of the layers present in a particular embodiment of the display 18. In this embodiment, the display 18 includes an OLED panel 150. The OLED panel 150 includes a substrate layer 152 (e.g., a glass substrate layer) on which a thin film transistor (TFT) layer may be formed. The TFT layer may define the various pixels 154 of the OLED display and allow each pixel 154 to be separately addressed. In one embodiment, each pixel 154 may include a layer or layers of organic light-emitting diodes 156 printed, deposited, or otherwise formed on the substrate layer 152 and the TFT layer. Each of the light-emitting diodes 156 may emit specific colors (e.g., red, green, and blue) such that their color combined with other light-emitting diodes 156 may form a color image. In alternative embodiments, the light-emitting diodes 156 may each emit white and a color filter may transform the white light into specific colors (e.g., red, green, and blue). The operation of the TFT layer and the corresponding pixels 154 of the OLED panel 150 may be coordinated and/or controlled by one or more driver chips 158 (such as a chip-on glass (COG)) in communication with the TFT layer and/or the one or more processors 12 (FIG. 1).

As previously discussed, the transparent regions 20 may be formed when a transparent display 18 is not emitting light in certain regions. For example, the pixels 154 may be transparent, enabling light to pass through them such that components behind the pixels may be seen when the pixels 154 are not emitting light. However, when the pixels 154 are emitting light, the pixels 154 may not allow light to pass through them, and thus the components behind the pixels 154 may not be seen. Because the pixels 154 may be separately addressed, the driver chips 158 and/or processor(s) 12 (FIG. 1) may control any combination of pixels 154 to stop emitting light, thus allowing for transparent regions (e.g., black spots) of numerous sizes and/or shapes to be formed.

The OLED panel 150 may also include a circular polarizer layer 160. The circular polarizer layer 160 may absorb a significant amount of the reflected light from the OLED panel 150. Further, the OLED panel 150 may also include a cover or external layer 162 (e.g., a cover glass) that forms the external viewing surface facing a viewer. In certain embodiments the cover layer 162 may perform various color filtration and/or polarization functions with respect to the light emitted by the OLED panel 150. In one embodiment, the cover layer 162 and the substrate layer 152 may be bonded together, such as by a glass frit bond 164, along all or part of the periphery of the surface and/or substrate layers. In one implementation, the OLED panel 150 is between about 1.5 mm and 1.9 mm in thickness.

The background layer 166 may be provided as a single or multiple layer structure of a solid color (e.g., white) or printed background. For example, in one embodiment the background layer 166 includes a transflective layer 168 positioned over a solid-color substrate layer 170, such as a white substrate layer. The transflective layer 168 acts to both reflect ambient light and to transmit the color, image, and/or pattern of the substrate layer 170. In one implementation, the background layer 166 is between about 0.5 mm and 1.0 mm in thickness.

As discussed above with regards to FIGS. 3A and 3B, it may be desirable to provide a printed image 40. As an alternative to the embodiment depicted in FIGS. 3A and 3B, where the printed image 40 is present behind the display 18, in certain embodiments, the display 18 may contain the printed image 40. In such embodiments, the substrate layer 170 may incorporate the printed image 40 (e.g., a corporate logo, emblem, name, or mark). The printed image 40, such as a logo, may not be visible when the display 18 is emitting light and thus not in a transparent state. However, when a black region is formed over the printed image 40 or the display 18 is powered off and, thus, not emitting light, the printed image 40 (e.g., the logo, emblem, or mark) present on or visible through the substrate layer 170 may become visible.

It may be desirable to tune the transparency of display 18, such that components 172 behind the display 18 may be more clearly visible through the transparent regions 20. By locally removing portions 174 of the circular polarizer layer 160, the transparency of the OLED panel 150 may be tuned to more clearly expose components 172. For example, light that would typically be absorbed by the circular polarizer layer 160 may reflect off of the components 172, thus illuminating them. Further, as illustrated in the depicted embodiment, transparent regions 20 may be formed by cutting out portions 176 of the background layer 166 such that components 172 positioned behind the background layer 166 may be visible when the display 18 is not emitting an image over the cut out portions 176. In alternative embodiments, the entire background layer 166 may be removed, thus providing a global transparent region 20.

Figure 7A:
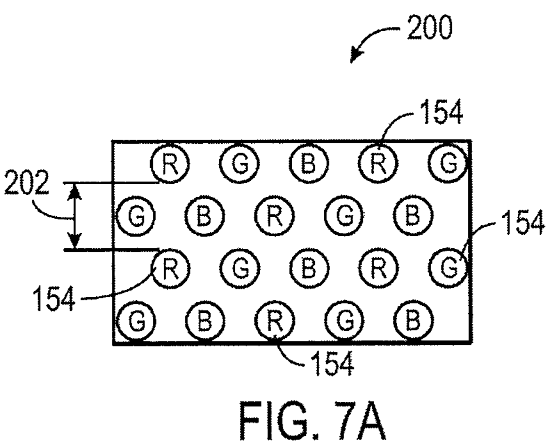
FIGS. 7A-7C are schematic diagrams of pixel arrangements within the transparent display, illustrating techniques to tune transparency of a display by adjusting the pixel pitch of the display, in accordance with an embodiment.

The transparency of the display 18 may also be tuned by modifying the pixel arrangement of the OLED panel 150. While the pixels 154 may be substantially transparent (e.g., 85% transparent), they may not be completely transparent. Thus, reducing the density of the pixels 154 may increase the transparency of the display 18 by creating light pathways in between the pixels 154. FIG. 7A illustrates a typical pixel arrangement 200 for a transparent display 18. In the depicted embodiment, each pixel 154 is enabled to emit a specific color of light. Each pixel 154 is labeled with an "R" for red emission, "G" for green emission, or "B" for blue emission. Typically, the display 18 may have a pixel arrangement with closely spaced pixels 154, or a high pixel pitch. The pixel pitch is the distance between pixels 154 of the same color. For example, in FIG. 7A, the distance 202 between the red pixels is minimal, such that a maximum number of pixels 154 may be placed within the display 18.

Figure 7B:
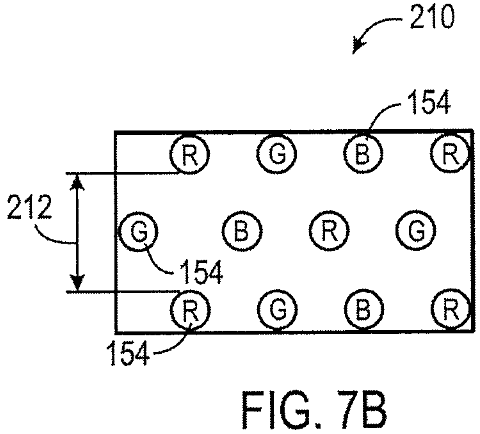

By decreasing the density of the pixels 154, the transparency of the display 18 may be increased. FIG. 7B illustrates a modified pixel arrangement 210 useful for tuning the transparent regions 20 (FIG. 1) of the display 18 by adjusting the spacing, or pitch of the pixels 154. As illustrated, the pixels 154 are spaced at a greater distance 212 than those in FIG. 7A. While the resolution of the display 18 may decrease through less densely placed pixels 154, the transparency of the display 18 may increase, thus providing a clearer view to or from components behind the display 18.

Figure 7C:
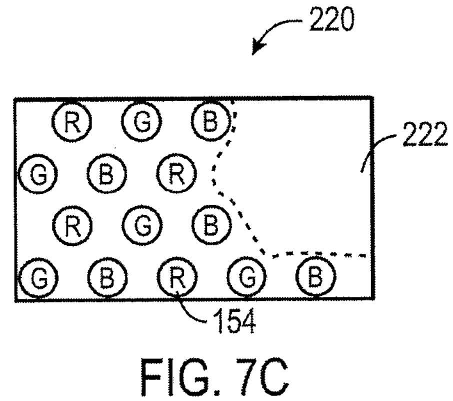

The increased pixel distances (e.g., decreased pixel density) may be implemented in the entire display 18 or specific regions of the display 18 where increased transparency is desired. In some embodiments, the display 18 may include regions where the pixel arrangement includes no pixels 154. For example, FIG. 7C illustrates one such embodiment of a pixel placement 220, where a tuned region 222 contains no pixels 154. Including one or more tuned regions 222 that do not have pixels 154 may enhance the transparency of such regions 222 by allowing light to freely pass through the layers of the display 18. In some embodiments, the tuned region 222 may be placed in areas of the display 18 where it may be less likely that a displayed image would be useful. For example, such tuned region 222 may be implemented at the edges and/or corners of the display 18.

Tuning transparency of a transparent display may result in enhanced usability of components placed behind the transparent display. Placing components that would typically be found on the surface of an electronic device enclosure behind a transparent display may increase the surface real-estate of the enclosure for a larger display or additional components. Further, the aesthetics of the electronic device may be greatly enhanced by not cluttering the device enclosure with always-visible components, but instead creating a more seamless electronic device where the components are only visible when they are in use.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. An electronic device comprising:

a display having a substrate, a polarizer, and an array of pixels on the substrate, wherein the array of pixels includes a first group of pixels and a second group of pixels and wherein the polarizer has a gap overlapping the first group of pixels;

a light sensor behind the display that detects light through an active area of the display, wherein the first group of pixels is interposed between the gap of the polarizer and the light sensor and is configured to emit light through the gap; and processing circuitry that selectively controls the first group of pixels to generate a transparent region that overlaps the light sensor while the second group of pixels displays an image.

2. The electronic device defined in claim 1 wherein the light sensor comprises a proximity sensor.

3. The electronic device defined in claim 1 wherein the light sensor comprises a camera.

4. The electronic device defined in claim 1 wherein the transparent region includes a portion of the array of pixels that is not emitting light.

5. The electronic device defined in claim 1 wherein the array of pixels is configured to display an image that hides the light sensor from view.

6. The electronic device defined in claim 1 wherein the light sensor is located behind the substrate.

7. The electronic device defined in claim 1 wherein the processing circuitry is configured to generate the transparent region in response to touch input on the display.

8. The electronic device defined in claim 1 wherein the array of pixels comprises organic light-emitting diode pixels.

9. The electronic device defined in claim 1 wherein the gap overlaps the light sensor.

10. The electronic device defined in claim 9 wherein the polarizer comprises a circular polarizer.

* * * * *